United States Patent
Iwasawa et al.

(10) Patent No.: US 8,114,473 B2
(45) Date of Patent: Feb. 14, 2012

(54) COMPOSITE STRUCTURE AND PRODUCTION METHOD THEREOF

(75) Inventors: Junichi Iwasawa, Fukuoka (JP); Hironori Hatono, Fukuoka (JP)

(73) Assignee: Toto Ltd., Fukuoka (JP)

( * ) Notice: Subject to any disclaimer, the term of this patent is extended or adjusted under 35 U.S.C. 154(b) by 960 days.

(21) Appl. No.: 12/150,317

(22) Filed: Apr. 25, 2008

(65) Prior Publication Data
US 2008/0274333 A1 Nov. 6, 2008

(30) Foreign Application Priority Data
Apr. 27, 2007 (JP) .............................. P. 2007-118739

(51) Int. Cl.
*B05D 1/12* (2006.01)
(52) U.S. Cl. ..................... 427/201; 427/190; 427/421.1; 427/427
(58) Field of Classification Search .................. 427/190, 427/201, 421, 427.7
See application file for complete search history.

(56) References Cited

U.S. PATENT DOCUMENTS

| | | | |
|---|---|---|---|
| 3,620,839 A | 11/1971 | Geckle et al. | |
| 4,109,860 A | 8/1978 | Serafin et al. | |
| 4,205,964 A | 6/1980 | Hill | |
| 4,391,733 A | 7/1983 | Lamar et al. | |
| 4,617,056 A | 10/1986 | Mosser et al. | |
| 4,660,986 A | 4/1987 | Leschonski et al. | |
| 5,143,288 A | 9/1992 | Kohler et al. | |
| 5,518,546 A | 5/1996 | Williams et al. | |
| 5,723,176 A | 3/1998 | Keyworth et al. | |
| 5,805,971 A | 9/1998 | Akedo | |
| 5,837,327 A | 11/1998 | Sue et al. | |
| 5,874,684 A | 2/1999 | Parker et al. | |
| 5,916,640 A | 6/1999 | Liu et al. | |
| 5,928,719 A * | 7/1999 | Mishima et al. .............. 427/180 |
| 6,280,802 B1 | 8/2001 | Akedo et al. | |
| 6,349,668 B1 | 2/2002 | Sun et al. | |
| 6,531,187 B2 | 3/2003 | Akedo | |
| 6,780,350 B1 | 8/2004 | Kodas et al. | |
| 7,153,567 B1 | 12/2006 | Akedo et al. | |

(Continued)

FOREIGN PATENT DOCUMENTS
EP 1 231 294 * 8/2002
(Continued)

OTHER PUBLICATIONS

Ikawa et al; The Electrostatic Fine Particle Coatig Method; Preprint for the Science Lecture Meeting, Autumn Convention, Precision Machine Society Showa 52 (1977).

(Continued)

*Primary Examiner* — Frederick Parker
(74) *Attorney, Agent, or Firm* — Carrier Blackman & Associates, P.C.; William D. Blackman; Joseph P. Carrier

(57) ABSTRACT

A composite structure having excellent plasma resistance includes a base material having a surface containing a ceramic polycrystal and a structure formed on the surface of the base material containing the ceramic polycrystal, wherein the structure contains a polycrystal containing a brittle material; a grain boundary layer having a glass layer does not substantially exist on a boundary face between crystals forming the polycrystal; a part of the polycrystal forms an anchor part embedded into the base material surface; and an average roughness (Ra) of an interface between the anchor part and the base material surface is 100 nm or less.

4 Claims, 1 Drawing Sheet

U.S. PATENT DOCUMENTS

2006/0102074 A1   5/2006  Hatono et al.

FOREIGN PATENT DOCUMENTS

| | | |
|---|---|---|
| JP | 04-188503 A | 7/1992 |
| JP | 04-331074 A | 11/1992 |
| JP | 8-081774 A | 3/1996 |
| JP | 10-202171 | 8/1998 |
| JP | 11-021677 A | 1/1999 |
| JP | 2000-212766 A | 8/2000 |
| JP | 2000-313970 A | 11/2000 |
| JP | 2001-003180 | 1/2001 |
| JP | 2002-309383 | 10/2002 |
| JP | 2003-183848 | 7/2003 |
| JP | 2005-314800 | 11/2005 |
| JP | 2005-314801 | 11/2005 |
| WO | WO 01-27348 | 4/2001 |

OTHER PUBLICATIONS

Seiichirou, Kashu; Kinzoku; Jan. 1989.

Accomplishment Report of 2001~2003 (on Commissioned Business of Independent Administrative Agency, New Energy and Industrial Technology Development Organization)-discussed in specification of above referenced application pp. 2-3.

Iwasawa et al., Plasma—"Resistant Dense Yttrium Oxide Film Prepared by Aerosol Deposition Process", J. Am. Ceram. Soc., 90 [8] 2327-2332 (2007), © 2007 The American Ceramic Society.

Iwasawa et al., "Dense Yttrium Oxide Film Prepared by Aerosol Deposition Process at Room Temperature", Journal of the Ceramic Society of Japan, 114 [3] pp. 272-276 (2006).

Hatono et al., "Multilayer Construction with Various Ceramic Films for Electronic Devices Fabricated by Aerosol Deposition", International Journal of Applied Ceramic Technology., 3 [6] pp. 419-427 (2006).

Iiwasawa et al., "Preparation of Transparent Yttrium Oxide Film by Aerosol Deposition Method", Transactions of the Materials Research Society of Japan 30[4] 1009-1012 (2005).

P. 86-87 of FC Report 23 (2005) No. 2 (Spring), with English abstract.

\* cited by examiner

COMPOSITE STRUCTURE AND PRODUCTION METHOD THEREOF

CROSS-REFERENCE TO RELATED APPLICATIONS

This application claims priority from Japanese Patent Application No. 2007-118739 filed on Apr. 27, 2007, the entire subject matter of which is incorporated herein by reference.

BACKGROUND OF THE INVENTION

1. Field of the Invention

An embodiment of this invention generally relates to a composite structure in which a structure containing a polycrystal comprising a brittle material is formed on a surface of a base material and a production method thereof.

2. Description of the Related Art

A method called aerosol deposition is disclosed in Patent Reference 1 as a method for forming a structure of a brittle material on a surface of a base material without any heating process and has widely been accepted.

The aerosol deposition method is characterized by injecting from a nozzle to a base material an aerosol obtained by dispersing fine particles of a brittle material or the like into a gas; bonding the brittle material fine particles by causing the fine particles to collide with the base material made from a metal, glass, ceramics, or a plastic to have the brittle material fine particles deformed or crushed by impact of the collision; and directly forming a structure formed of formation materials of the fine particles on the base material. The aerosol deposition method is capable of forming a structure particularly at an ordinary temperature that does not require any heating means as well as of obtaining a structure having mechanical strength similar to that of a sintered body.

Also, Patent Reference 2 discloses collision of superfine particles that are injected as being accelerated by electrostatic field or gas feeding with superfine particles on a substrate.

Non-patent Reference 1 discloses that surface roughness of a substrate influences on film formation. Specifically, it has been reported that: it is impossible to form a film when average surface roughness (Ra) of a ceramic base material is 56 nm; it is possible to form a film when the average surface roughness (Ra) is 142 nm; and, when the average surface roughness is 376 nm, film peeling occurs when a film thickness is 10 μm or more though it is possible to form a film.

[Patent Reference 1] WO01/027348
[Patent Reference 2] JP-A-2001-3180
[Non-patent Reference 1] Accomplishment Report on Commissioned Business of Independent Administrative Agency, New Energy and Industrial Technology Development Organization; Title: Accomplishment Report of 2001 to 2003, <Lead Phase> Research and Development of Fundamental Technologies for Effective Energy Use, Research and Development on Energy Rationalization Technology of Ceramic Engineering Process Utilizing Impact Bonding Effect

SUMMARY OF THE INVENTION

As is disclosed in Non-patent Reference 1, in the case of adapting the aerosol deposition method to a ceramic base material, it has been difficult to form a film on a mirror surface having surface roughness of 100 nm or less. Also, though it has been possible to form a film in the case where the base material surface roughness exceeds 100 nm, there have been problems of restricted formation conditions and unable to achieve a dense structure due to influences of minute irregularity and pores existing on the surface. Also, in the case where relatively large pores exist on the surface, there have been drawbacks that a ceramic film formation is impossible or a film is subject to peeling after the film formation since fine particles that did not form a film are accumulated and clogged inside the pores. That is, it has been difficult to ensure a uniform and high quality film on a whole surface having a certain film area.

In turn, in plasma resistant products for vacuum apparatuses in which a plasma resistant film such as an yttrium oxide film is formed by the aerosol deposition method on a base material having a ceramic surface, yttrium oxide is gradually consumed from a surface of the yttrium oxide film due to plasma irradiation. In the case where the film has the above-described drawbacks, such consumption is so violent as to cause corrosion of the base material, thereby raising problems of generation of unnecessary particles and formation of irregularity on the base material.

In these plasma resistant products for vacuum apparatuses, in order to suppress a production cost of a product, there is a need for performing re-formation (repair) of a film by: detaching the product at the time point when a certain amount of the plasma resistant film is consumed; removing the plasma resistant film, and performing cleaning. Such repair is a very effective means in the case where the product has a large size or a complicated shape and is limited in part that requires the plasma resistance. However, in the case where there is a defect such as a partial lack of the film or deficiency in film density as described above, there has been a problem that it is impossible to perform the repair due to roughening of the surface that is caused by unnecessary corrosion of a part of the base material by the plasma.

As a method of producing a composite structure according to this invention in order to solve the above-described problems, there is provided a method of producing a composite structure comprising forming a structure comprising a brittle material on a base material surface having a surface comprising a ceramic polycrystal by an aerosol deposition method, comprising forming a structure comprising the brittle material on the base material surface having the surface comprising the ceramics polycrystal having the average surface roughness (Ra) of 100 nm or less by generating an aerosol by mixing a powder comprising particles of the brittle material and having a 50%-average particle diameter on volumetric basis of 0.1 to 1.0 μm with a carrier gas and injecting the aerosol to the base material surface having the surface comprising the ceramic polycrystal at a high speed.

In the method of producing a composite structure, the surface roughness (Ra) of the base material surface having the surface comprising the ceramic polycrystal may preferably be 5 nm or more in view of a base material polishing cost and improvements in density of the ceramic polycrystal. That is, in the method of producing a composite structure, the surface roughness (Ra) of the base material surface having the surface comprising the ceramic polycrystal may preferably be in the range of 5 to 100 nm, more preferably 5 to 90 nm, particularly preferably 5 to 30 nm.

The 50%-average particle diameter based on volumetric basis of the particles comprising the brittle material may preferably be 0.1 to 1.0 μm in view of improvements in efficiency of structure formation, more preferably 0.1 to 0.7 μm, particularly preferably 0.2 to 0.5 μm.

Further, in the method of producing a composite structure, the ceramic crystal may be selected among those having a Vickers hardness of a structure forming surface of 1,100 Hv or more. Examples of the material include aluminum oxide, silicon carbide, silicon nitride, aluminum nitride, zirconium oxide, complex composition ceramic materials thereof formed by adding thereto another element such as yttrium or another rare earth element, and the like.

A composite structure according to this invention comprises a base material having a surface comprising a ceramic polycrystal and a structure formed on the surface of the base material comprising the ceramic polycrystal, wherein the structure comprises a polycrystal comprising a brittle material; a grain boundary layer having a glassy layer does not substantially exist on a boundary face between crystals forming the polycrystal; a part of the polycrystal forms an anchor part embedded into the base material surface; and average roughness (Ra) of an interface between the anchor part and the base material surface is 100 nm or less.

When the average roughness (Ra) of the interface between the anchor part and the base material surface is 100 nm or less, it is possible to perform film re-formation by exposing the base material surface by removing a residual layer by the method such as dissolution after a certain amount of the plasma resistant film is consumed due to the plasma irradiation. Alternatively, after exposing the base material, the surface is subjected to a simple polishing processing such as buff polishing to obtain easily and in a short time a surface having appropriately small surface roughness (Ra) of the base material that will not cause defects on the film, thereby making it possible to use the regenerated base material for film re-formation (repair). Thus, it is possible to obtain a dense and uniform film again.

Examples of the structure to be formed on the surface of the base material include yttrium oxide, aluminum oxide, mixtures thereof, and the like. In the case where the structure is yttrium oxide, the yttrium oxide structure is polycrystalline and a grain boundary layer having a glass layer does not substantially exist on a boundary face between crystals, and a part thereof forms an anchor part embedded into the base material surface. Yttrium oxide is effective when formed on an inner surface of a chamber of a plasma processing apparatus.

The average roughness (Ra) of an interface between the anchor part and the base material surface may preferably be 10 nm or more. The average roughness of 10 nm or more improves an adhesion property. That is, the average roughness (Ra) of the interface between the anchor part and the base material surface may preferably be in the range of 10 to 100 nm, more preferably 10 to 90 nm, particularly preferably 10 to 30 nm.

The ceramic polycrystal may be selected among those having a Vickers hardness of a structure forming surface of 1,100 Hv or more. Examples of the material include aluminum oxide, silicon carbide, silicon nitride, aluminum nitride, zirconium oxide, composite composition ceramic materials thereof formed by adding thereto another element such as yttrium or another rare earth element, and the like. Also, a material having formed on the surface an aluminum oxide layer by anodically oxidizing aluminum is usable.

As a pre-processing of the film re-formation (repair), the method of removing the plasma resistant film containing yttrium oxide from the base material by bringing a necessary part of the member into contact with an acid aqueous solution of chloric acid, nitric acid, or the like by dipping or the like is preferred due to its simplicity. Further, from the view points of film removal rate, handling of acid aqueous solution, damage to base material, and the like, it is preferable to employ a method of using an acid aqueous solution that is diluted to about 5 to 15 wt %. A time for dipping may be selected from 1 to 30 minutes, and the dipping time may be set depending on a thickness of the residual yttrium oxide film.

Also, it is possible to provide a composite structure comprising a base material and a structure formed on at least a part of the base material, wherein the structure is formed at a position irradiated with plasma.

DETAILED DESCRIPTION OF THE INVENTION

Figure 1:
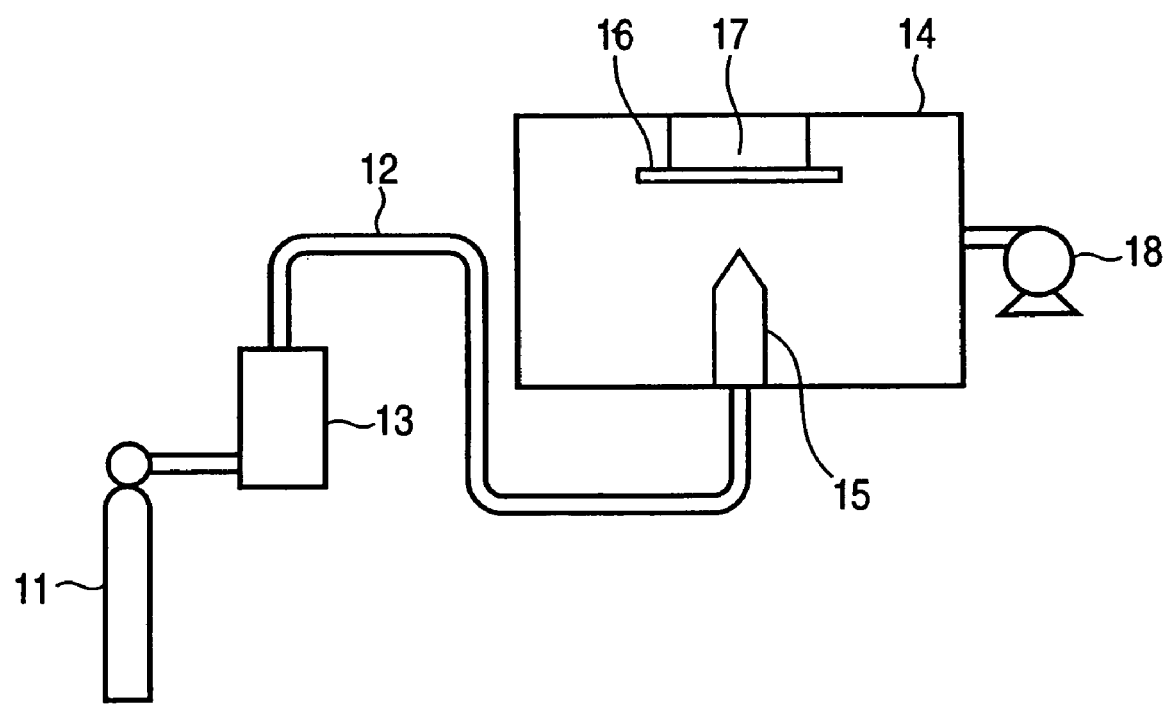
FIG. 1 is a schematic block diagram showing a composite structure manufacturing apparatus employing an aerosol deposition method.
Explanation of References
11: gas cylinder
12: carrier pipe
13: aerosol generator
14: structure forming apparatus
15: nozzle
16: base material
17: XY stage
18: discharge pump

Hereinafter, terms used in this specification will be described.
(Fine Particles)

In the case where primary particles are dense particles, the primary particles mean those having an average particle diameter of 10 μm or less that is identified by a particle size distribution measurement or a scanning electron microscope. In the case where primary particles are porous particles that are subject to crushing by impact, the primary particles mean those having an average particle diameter of 50 μm or less.
(Aerosol)

An aerosol is obtained by dispersing the fine particles into a gas such as a nitrogen gas, an oxygen gas, a dried air, and a mixture gas thereof. Though it is preferable that the primary particles are dispersed in the aerosol, the aerosol generally includes agglomerated particles of the primary particles. Though a gas pressure and a temperature of the aerosol are arbitrarily selected, it is desirable that a concentration of the fine particles in the gas is in the range of 0.0003 to 10 mL/L at the time point when the aerosol is injected from a nozzle when the gas pressure and the temperature are converted to 1 and 20° C.
(Carrier Gas)

The carrier gas to be used in this invention is not particularly limited insofar as the carrier gas generates an aerosol when mixed with a powder containing particles containing a brittle material, and preferred examples thereof include a nitrogen gas, an oxygen gas, a helium gas, an argon gas, a mixture gas thereof, a dried air, and the like.
(Polycrystal)

The polycrystal in this specification means a structure wherein crystallites are bonded and accumulated. Each of the crystallites is substantially capable of forming a crystal and generally has a diameter of 5 nm or more. Fine particles can sometimes be taken into the structure without being crushed, but such structure is substantially considered to be the polycrystal.
(50%-Average Particle Diameter on Volumetric Basis)

An average particle diameter is calculated by using a laser diffraction method as a general rule. A particle diameter when a cumulative volume of fine particles obtained by adding the diameters in ascending order reaches to 50% is used. It is possible to use a commercially available laser diffraction particle size distribution meter for average particle diameter measurement employing the laser diffraction method.

Also, when the agglomeration of primary particles is too strong to obtain usable data by the laser diffraction method, the average particle diameter is calculated by employing an air permeation method. It is possible to use Fisher sub-sieve sizer manufactured by Fisher Scientific Inc. for average particle diameter measurement by the air permeation method.
(Ra)

Each of Surface Roughness Ra of the Base Material Surface and Surface roughness Ra of the interface (anchor part) between the substrate surface and the film means a value obtained by calculating an average value of values of 5 or more points measured by using a probe type surface roughness shape measurement device (SURFCOM 130A manufactured by Tokyo Seimitsu Co., Ltd.). An evaluation length and a cut-off value for the measurement are decided in accordance with JIS standard. See JIS B0601-1994 herein incorporated by reference for details.
(High Speed)

High speed in this specification means an average speed of 50 to 450 m/sec from a position distant from a nozzle opening by 5 mm to a position distant from the nozzle opening by 24 mm.
(Film Formation Aiding Particles)

Film formation aiding particles in this specification mean aluminum oxide ($Al_2O_3$) fine particles having an average diameter of 1.0 to 5.0 μm and having a role of forming a film of yttrium oxide by generating a new surface by deforming or crushing yttrium oxide fine particles. Also, fine particles having an average diameter of 1.0 to 5.0 μm other than the aluminum oxide fine particles may be used.
(Ceramic Polycrystal)

Ceramic polycrystal means a sintered body such as an oxide, a nitride, a boride, and a carbide that is formed by sintering ceramic fine particles and a ceramic polycrystalline layer on a surface obtained by oxidizing a metal host material surface, such as an alumite layer.
(Base Material)

The base material to be used in this invention is not particularly limited insofar as the base material contains the ceramic polycrystal on its surface, and preferred examples thereof include aluminum oxide, silicon carbide, silicon nitride, aluminum nitride, zirconium oxide, composite composition ceramic materials thereof formed by adding thereto another element such as yttrium or another rare earth element, and the like.
(Fragile Material)

A brittle material means a material wherein ion bonding or covalent bonding is a main bonding of chemical bonding between atoms, and a ceramic material is mainly used.
(Vickers Hardness)

Vickers hardness is detected by using a commercially available Vickers hardness tester. For example, HV-112 or 114 manufactured by Akashi Inc. is usable. JIS Z 2244 can be referred to for a measurement method, the entire contents thereof being herein incorporated by reference.
(Anchor Part)

The anchor part in this specification means irregularity that is formed on the interface between the base material and the structure, particularly, the irregularity formed by changing a surface accuracy of an original base material during formation of the structure, and not the irregularity formed on the base material preliminarily. It is possible to determine the irregularity by observing and measuring a base material surface before structure formation and an irregularity state at a base material side of an interface between the base material and the structure after the structure formation. It is possible to judge absence/presence of the anchor part by removing the structure from the base material and comparing a surface profile of an interface part of the base material and a surface profile of the original base material.

Since the composite structure according to this invention has strong adhesion strength and is excellent in plasma resistance, the composite structure is effectively formed on an inner surface of a chamber of a plasma processing apparatus.

Particularly, in the case where the yttrium oxide film formed on a substrate of a production apparatus incorporated into a semiconductor and FPD (Flat Panel Display) production apparatus used in an environment exposed to plasma is consumed by long term use, it is possible to regenerate the yttrium oxide film only according to the method of this invention.

The substrate used in a semiconductor or an FPD (Flat Panel Display) production apparatus is large and has a complicated shape, the regeneration of only the yttrium oxide film is advantageous in terms of cost.

FIG. 1 is a schematic block diagram showing a plasma resistant member manufacturing apparatus, wherein a gas cylinder 11 containing nitrogen, dried air or the like is connected to an aerosol generator 13 via a carrier pipe 12, and a nozzle 15 is disposed inside a structure forming apparatus 14 via the carrier pipe 12. A base material 16 is disposed on an XY stage 17 as facing to the nozzle 15 with a gap of 10 mm being defined between the base material 16 and the nozzle 15, the XY stage 17 being placed in front of the nozzle 15. The structure formation chamber 14 is connected to a discharge pump 18.

After filling the aerosol generator 13 with a material powder, the gas cylinder 11 is opened to introduce the dried air into the aerosol generator 13 via the carrier pipe 12, thereby generating an aerosol in which the material powder is dispersed into the gas. The aerosol is carried toward the structure formation chamber 14 via the carrier pipe 12, and the material powder is injected toward the base material 16 as being accelerated to the high speed.

In this embodiment, a mixed powder of yttrium oxide ($Y_2O_3$) fine particles and aluminum oxide ($Al_2O_3$) fine particles having a larger diameter than that of the former fine particles is used as a material for forming the plasma resistant layer.

The aluminum oxide fine particles are used for generating a new surface by deforming or crushing the yttrium oxide fine particles and do not serve as a constituent material of the film because they are reflected after the collision though some of them inevitably contaminate the film. Therefore, the material is not limited to aluminum oxide, and yttrium oxide or the like may be used. However, aluminum oxide is the optimum material in view of cost.

In this case, yttrium oxide is referred to as film forming particles, and aluminum oxide is referred to as a film formation aiding particles. The film forming particles may have a 50%-average particle diameter on volumetric basis of 0.1 to 1.0 μm, and the film formation aiding particles have a 50%-average particle diameter on volumetric basis of 1.0 to 5.0 μm. The mixed powder is prepared by mixing these particles preliminarily.

EXAMPLES

Hereinafter, specific examples and comparative examples will be described.

Example 1

Yttrium oxide ($Y_2O_3$) fine particles and aluminum oxide ($Al_2O_3$) fine particles were prepared. 50%-average particle diameters on volumetric basis of the yttrium oxide fine particles and the aluminum oxide fine particles were 0.47 μm and 2.1 μm.

These fine particles were mixed at a number ratio of 1:10 (aluminum oxide fine particles:yttrium oxide fine particles) to obtain a particle mixture.

The particle mixture was charged into an aerosol generator of the apparatus, and an aerosol generated by supplying a nitrogen gas as a carrier gas at a feed rate of 5 L/min was injected to a quartz base material. Thus, an yttrium oxide film having a height of 10 μm, an area of 20 mm×20 mm, and a light transmitting property was formed on the base material.

A plasma resistance test result and a contact strength measurement result of the thus-obtained yttrium oxide film are shown in Table 1. In the plasma resistance test, plasma processing was performed by using a parallel flat plate type RIE apparatus (DEA506 manufactured by ANELBA) and a corrosive gas of $CF_4$ (40 sccm)/$O_2$ (10 sccm) at a high frequency of 1 kW and 13.56 MHz to measure a depth of corrosion of the film. In the contact strength measurement, a columnar rod manufactured by Stainless steel was cured on the film surface at 120° C.×1 h by using an epoxy resin, and the columnar rod was pulled down in a direction of 90° by using a desktop small tester (EZ Graph manufactured by Shimadzu Corporation) to evaluate the adhesion strength.

TABLE 1

|  | Yttrium Oxide Film | Quartz |
|---|---|---|
| Depth of Corrosion (nm) | 560 | 23,300 |
| Adhesion Strength (MPa) | 80 | — |

Table 2 indicates a relationship between surface roughness and film formation capability of an initial substrate (before formation of yttrium oxide film). From Table 2, it is apparent that the film formation capability is different based on the material of the substrate. In Table 2, ○ means good film formation capability, Δ means an inferior film property though film formation was capable, and × means not capable of film formation.

TABLE 2

| Substrate Material | Ra (μm) and Film Formation Capability | | | |
|---|---|---|---|---|
| Alumina | Ra 0.025 ○ | Ra 0.1 ○ | Ra 0.7 Δ | Ra 1.2 × |
| Alumite Treatment | Ra 0.04 ○ | | Ra 0.5-0.8 × | |

The method of this invention is an effective method wherein a structure is formed without defects in the case where the base material surface roughness is 100 nm or less. Also, it is possible to set the surface roughness (Ra) of the interface between the anchor part and the base material surface to a predetermined value by controlling energy of collision of the brittle material fine particles depending on the material of the base material when forming the structure that is the plasma resistant film. For example, the control includes the optimization of the film forming particles and the film formation aiding particles within the predetermined range and the adjustment of the feed rate of the carrier gas as described above.

Also, shown in Table 3 is a graph indicating initial surface roughness (Ra) (before yttrium oxide film formation) of a substrate of sintered alumina and surface roughness (Ra) of an interface (anchor part) between the substrate and the film.

Measurements were conducted at 6 points by using a surface roughness shape measurement device (Surfcom 130A) manufactured by Tokyo Seimitsu Co., Ltd. and under the conditions of an evaluation length of 0.4 mm and a cut off length of 0.08 mm. An yttrium oxide film having a film thickness of 4 μm was formed on the base material by employing the aerosol deposition method. After that, the yttrium oxide film was selectively removed with an acid aqueous solution to expose an interface (anchor part) between the yttrium oxide film and alumina, and surface roughnesses at 6 points of the interface were measured under the conditions described above. A hardness of alumina of the base material was 1,300 Hv or more.

TABLE 3

|  | Substrate Surface Ra (μm) | Anchor Part Ra (μm) |
|---|---|---|
| 1 | 0.010 | 0.019 |
| 2 | 0.011 | 0.016 |
| 3 | 0.012 | 0.022 |
| 4 | 0.009 | 0.015 |
| 5 | 0.010 | 0.013 |
| 6 | 0.007 | 0.018 |

As shown in Table 3, the surface roughness Ra of the interface between the base material and the structure after the structure formation is increased as compared to the surface roughness Ra of the base material (substrate) surface before the structure formation (before film formation), and the interface is used as the anchor to increase an adhesion force of the structure to the base material. Also, in the case of the ceramic base material having the high hardness, a degree of roughening of the base material surface caused by the structure formation is 10 nm or less in terms of a change in surface roughness.

Since it is possible to easily remove the yttrium oxide film with the acid aqueous solution, when a certain amount of the yttrium oxide film formed on the substrate surface is consumed, the yttrium oxide film is removed with the acid aqueous solution before the substrate is damaged, and a new yttrium oxide film is formed thereon to enable film regeneration. Also, in the case where the surface roughness Ra of the substrate is sufficiently smaller than 100 nm, the surface roughness Ra of 100 nm or less is often maintained after the removal of the yttrium oxide film, which is effective for film re-formation.

As described in the foregoing, it was found that it is possible to achieve formation of high quality film by the refinement of the film formation conditions even when the base material wherein surface roughness of the substrate is 100 nm or less was used. It is considered that, even in the case of using a ceramic polycrystal as a base material on which an anchor part having high hardness is not easily formed, film formation is enabled by forcibly forming an anchor part as a result of optimizing collision energy of fine particle collision in the aerosol deposition method, and that repair was enabled by suppressing surface roughness of the base material after the film removal to a constant level as a result of controlling the anchor part without unnecessarily deepening the anchor part. That is, the important point of the film formation and the repair is the optimization of the control of the fine particle collision energy in the aerosol deposition method, and, since the above-specified film formation conditions are not more than one example of means for achieving the film formation and the repair, any film formation technology capable of achieving average surface roughness (Ra) of the interface between the ceramic polycrystal and the anchor part of 100 nm or less may be employed without particularly limiting thereto.

What is claimed is:

1. An aerosol deposition method of producing a composite structure, comprising the steps of:

generating an aerosol by mixing a powder comprising yttrium oxide fine particles having a 50%-average particle diameter on volumetric basis of 0.1 to 1.0 μm with a carrier gas; and ejecting the aerosol so that it impacts against a base material surface at a high speed so as to form the composite structure on the base material surface;

wherein the base material surface consists of a ceramic polycrystal and has an average surface roughness (Ra) of 100 nm or less;

wherein the powder further comprises film formation aiding particles having an average particle diameter larger than the yttrium oxide fine particles so as to deform or crush the yttrium oxide fine particles in the ejecting step; and a Vickers hardness of a surface of the ceramic polycrystal base material is 1,100 Hv or more.

2. The method of producing a composite structure according to claim 1, wherein surface roughness (Ra) of the base material surface is at least 5 nm.

3. The method of producing a composite structure according to claim 1, wherein the 50%-average particle diameter on volumetric basis of the film formation aiding particles is 1.0 μm to 5.0 μm.

4. The method of producing a composite structure according to claim 1, wherein the film formation aiding particles are $Al_2O_3$ particles.

* * * * *